United States Patent
Choi

(10) Patent No.: US 7,816,776 B2
(45) Date of Patent: Oct. 19, 2010

(54) STACKED SEMICONDUCTOR DEVICE AND METHOD OF FORMING SERIAL PATH THEREOF

(75) Inventor: Young-Don Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 141 days.

(21) Appl. No.: 12/274,134

(22) Filed: Nov. 19, 2008

(65) Prior Publication Data

US 2009/0127668 A1 May 21, 2009

(30) Foreign Application Priority Data

Nov. 21, 2007 (KR) .................. 10-2007-0119214

(51) Int. Cl.
*H01L 23/02* (2006.01)
*H01L 21/00* (2006.01)

(52) U.S. Cl. .............. 257/686; 257/738; 257/774; 257/777; 257/E23.011; 257/E23.012; 257/E23.021; 257/E23.067; 257/E23.145; 438/106; 438/107; 438/108; 438/613

(58) Field of Classification Search .......... 257/686, 257/723, 737, 738, 774, 776, 777, E23.011, 257/E23.012, E23.021, E23.067, E23.145; 438/106, 107, 613
See application file for complete search history.

(56) References Cited

U.S. PATENT DOCUMENTS 6,924,551 B2 * 8/2005 Rumer et al. ............. 257/688

2004/0007778 A1 * 1/2004 Shinozaki et al. ......... 257/759
2004/0021139 A1 * 2/2004 Jackson et al. ............ 257/40
2007/0170575 A1 * 7/2007 Lee et al. ................ 257/686

FOREIGN PATENT DOCUMENTS

| JP | 2003-168786 | 6/2003 |
| JP | 2005-141829 | 6/2005 |
| KR | 1020020023120 A | 3/2002 |
| KR | 1020070035175 A | 3/2007 |

* cited by examiner

*Primary Examiner*—Michelle Estrada
(74) *Attorney, Agent, or Firm*—Myers Bigel Sibley & Sajovec, P.A.

(57) ABSTRACT

A stacked semiconductor device and a method of forming a serial path of the stacked semiconductor device are provided. The stacked semiconductor device includes a plurality of chips each having a first internal circuit for receiving an input signal, performing a designated operation and outputting an output signal. Each of the chips includes a serial bump disposed at the same position on one surface of each of the chips, receiving the input signal and transferring the input signal to the first internal circuit, and a serial through-silicon via (TSV) disposed at a position symmetrical to the serial bump with respect to a center of the chip to penetrate the chip, and receiving and transferring the output signal. Here, the chips are alternately rotated and stacked, so that the serial TSV and the serial bumps of adjacent chips contact each other. According to the stacked semiconductor device and method, a plurality of chips having the same pattern are rotated about the center of the chips and stacked, so that a parallel path and a serial path can be formed.

10 Claims, 6 Drawing Sheets

STACKED SEMICONDUCTOR DEVICE AND METHOD OF FORMING SERIAL PATH THEREOF

CROSS-REFERENCE TO RELATED APPLICATION

This application claims the benefit of Korean Patent Application No. 10-2007-0119214, filed Nov. 21, 2007, the disclosure of which is hereby incorporated herein by reference in its entirety.

FIELD OF THE INVENTION

The present invention relates to semiconductor devices and, more particularly, to stacked semiconductor devices connected via through-silicon-vias.

BACKGROUND

With the miniaturization and multifunctionalization of electronic devices, semiconductor devices have also been highly integrated and multifunctionalized. As a result of such demands, a Multi-chip Package (MCP) semiconductor device in which a plurality of chips are integrated has been introduced. MCP semiconductor devices may be classified into single-layer MCP semiconductor devices and multi-layer MCP semiconductor devices. The single-layer MCP semiconductor device can be packaged by arranging a plurality of chips in a regular line, and the multi-layer MCP semiconductor device, which is generally known as a stacked semiconductor device, can be packaged by stacking a plurality of chips.

A stack-type semiconductor device can have a plurality of stacked chips and thus have a three-dimensional structure. A conventional stacked semiconductor device can connect input/output terminals on a plurality of chips to each other or connect the input/output terminals of each of the chips to its external connection terminal through wire bonding, and thus inputs/outputs various signals. However, the use of wire bonding can deteriorate the performance of the semiconductor device due to an increase in inductance, and can increase the size of the semiconductor device.

Wafer-level processed Stack Package (WSP) technology has also been developed. According to the WSP technology, a via hole vertically penetrating a plurality of stacked chips can be formed using a laser at wafer level and is filled with a through-silicon via (TSV) to directly connect the circuits of the respective stacked chips. A stacked semiconductor device employing the WSP technology can directly connect the respective stacked chips and thus may avoid utilizing a discrete wire. In addition, a vertical interval between the chips may be reduced, and thus it may be possible to decrease the thickness of the stacked semiconductor device. Furthermore, the mounting area of the semiconductor device may be reduced.

In a stacked semiconductor device employing the WSP technology, transfer paths for transferring signals between a plurality of stacked chips may be roughly classified into two types. One type is a parallel path through which the same signal is simultaneously transferred to multiple chips, and the other type is a serial path in which a chip receiving a signal performs a specific operation in response to the applied signal and then transfers the applied signal or a signal generated as the result of the operation to another chip in sequence. This is sometimes referred to as a "daisy-chained" configuration.

FIGS. 1A and 1B are conceptual diagrams of a parallel path and a serial path of a stacked semiconductor device using the WSP technology, respectively.

FIGS. 1A and 1B illustrate an example of a four-stage stacked semiconductor device in which four chips C1 to C4 are stacked. In FIG. 1A, a parallel line PL is connected to all of the chips C1 to C4 and simultaneously transfers an input common signal SC to the four chips C1 to C4. Internal circuits 11 to 14 respectively included in the four chips C1 to C4 perform designated operations in response to the common signal SC and output common output signals SCO1 to SCO4, respectively. The common output signals SCO1 to SCO4 respectively output from the four chips C1 to C4 may be identical to or different from each other. In addition, the four chips C1 to C4 may not output the common output signals SCO1 to SCO4.

In FIG. 1B, serial lines SL1 to SL4 are connected in a daisy-chained configuration. The serial line SL2 is connected between the chips C1 and C2, and the serial line SL3 is connected between the chips C2 and C3. Therefore, the serial lines SL1 to SL4 may not directly transfer the same signal to all of the stacked chips C1 to C4, but rather components are interspersed. Internal circuits 21 to 24 receive an input signal SI applied from outside and output signals SO1 to SO3 applied from previous chips through the serial lines SL1 to SL4, perform designated operations and output the output signals SO1 to SO4, respectively.

In general, a stacked semiconductor device utilizes all of the parallel line PL and the serial lines SL1 to SL4. For example, signals transferred through the parallel line PL can be a command signal, an address signal, a data signal, a control signal, an input/output signal, etc., and signals transferred through the serial lines SL1 to SL4 can be a chip Identification (ID) signal, a test signal, etc. Besides the above mentioned signals, a drive voltage such as a supply voltage or a ground voltage, for driving the respective chips C1 to C4 may be transferred through the parallel line PL or the serial lines SL1 to SL4.

However, the signals are not set to be necessarily transferred through the parallel line PL or the serial lines SL1 to SL4. Rather, the respective signals are set to be transferred through the parallel line PL or the serial lines SL1 to SL4 according to the semiconductor device and functions of the respective chips C1 to C4.

In FIG. 1A, the parallel line PL is connected to all of the stacked chips C1 to C4 and thus can be disposed at the same positions in the respective chips C1 to C4. In other words, the positions of the parallel line PL in the respective chips C1 to C4 can be identical. On the other hand, in FIG. 1B, the serial lines SL1 to SL4 can be disposed at different positions in the respective chips C1 to C4. Therefore, the respective chips C1 to C4 can be designed such that the serial lines SL1 to SL4 are disposed at the same positions as in adjacent chips. In addition, via holes are formed at different positions in the respective chips C1 to C4, and thus the respective chips C1 to C4 can utilize separate processes. Therefore, the patterns of the chips C1 to C4 can be designed in consideration of the positions of the serial lines SL1 to SL4 in adjacent chips.

FIGS. 2A and 2B illustrate two chips having different patterns and a stacked semiconductor device in which a parallel path and a serial path can be formed by stacking the chips, respectively.

As mentioned above, when the positions of serial lines in respective chips differ from each other in a stacked semiconductor device having a plurality of chips, the plurality of chips stacked in the stacked semiconductor device can be configured to form a parallel path and a serial path regardless of the number of the stacked chips even if the chips have only two patterns.

In FIG. 2A, a first chip PA and a second chip PB have different via hole patterns, and the respective via holes are filled with through-silicon vias TSV. On one surface of the respective chips PA and PB, bumps MB are prepared for electrically connecting the chips PA and PB with the through-silicon vias TSV of adjacent chips and forming a space between the chips PA and PB. In addition, between the through-silicon vias TSV and the bumps MB on the chips PA and PB, internal circuits (not shown) are prepared for performing designated operations.

FIG. 2B illustrates a stacked structure of the first and second chips PA and PB. On the parallel lines PL of the chips PA and PB shown in FIGS. 2A and 2B, the through-silicon vias TSV and the bumps MB are disposed at the same position. On the other hand, on the serial line SL of the chips PA and PB, the through-silicon vias TSV and the bumps MB are disposed at different positions because the internal circuits are provided between the through-silicon vias TSV and the bumps MB.

As illustrated in FIGS. 2A and 2B, in a stacked semiconductor device including chips having two patterns, a parallel path and a serial path can be formed according to the positions of the through-silicon vias TSV and the bumps MB constituting the parallel lines PL and the serial lines SL regardless of the number of the stacked chips having the two patterns. Therefore, in order to design an internal circuit of a chip, one of the two patterns is selected according to a position where the chip is disposed, and only the positions of the through-silicon vias TSV and the bumps MB designated to the selected pattern may be considered. In other words, it may not be necessary to consider the pattern of an adjacent chip. In addition, since there are only two patterns, processes for forming a parallel path and a serial path may also be limited to two types.

SUMMARY

Example embodiments provide a stacked semiconductor device in which a plurality of chips having the same via hole pattern are alternately rotated about the center of the chips and stacked to form a serial path and a parallel path.

Other example embodiments provide a method of forming the serial path of the stacked semiconductor device.

In one aspect, the invention is directed to a stacked semiconductor device including: a plurality of chips each having a first internal circuit for receiving an input signal, performing a designated operation and outputting an output signal, wherein each of the chips includes: a serial bump disposed at the same position on one surface of each of the chips, receiving the input signal, and transferring the received input signal to the first internal circuit; and a serial through-silicon via (TSV) disposed at a position symmetrical to the serial bump with respect to a center of the chip to penetrate the chip, and receiving and transferring the output signal, and the chips are alternately rotated and stacked such that the serial TSV and the serial bumps of adjacent chips contact each other.

Each of the chips may further include: a second internal circuit for receiving/outputting a first common signal; a first parallel bump disposed at the same position on the surface of each of the chips, and inputting/outputting the first common signal to/from the second internal circuit; a first parallel TSV disposed at the same position as the first parallel bump to penetrate the chip, and transferring the first common signal; a second parallel bump disposed at a position symmetrical to the first parallel bump with respect to the center of the chip on one surface of the chip, and inputting/outputting the first common signal to/from the second internal circuit; and a second parallel TSV disposed at the same position as the second parallel bump to penetrate the chip, and transferring the first common signal.

Each of the chips may further include: a first switch connected between the first parallel bump and the second internal circuit, and selecting and transferring one of the first common signal and a second common signal to the second internal circuit; and a second switch connected between the second parallel bump and the second internal circuit, and transferring the other of the first common signal and the second common signal that is not selected by the first switch to the second internal circuit.

Each of the chips may further include: a first control bump disposed at the same position on the surface of each of the chips, receiving a first control signal for controlling the first switch to select one of the first and second common signals, and transferring the received first control signal to the first switch; a first control TSV disposed at the same position as the first control bump to penetrate the chip, and transferring the first control signal; a second control bump disposed at a position symmetrical to the first control bump with respect to the center of the chip on one surface of the chip, receiving a second control signal for controlling the second switch to select the other of the first and second common signals, and transferring the received second control signal to the second switch; and a second control TSV disposed at the same position as the second control bump to penetrate the chip, and transferring the second control signal.

The first and second switches may be multiplexers (MUXs).

In another aspect, the invention is directed to a method of forming a serial path of a stacked semiconductor device including a plurality of chips each having a first internal circuit for receiving an input signal, performing a designated operation and outputting an output signal, the method including: forming a serial bump for receiving the input signal and transferring the received input signal to the first internal circuit at the same position on one surface of each of the chips; forming a serial through-silicon via (TSV) for receiving the output signal and transferring the output signal at a position symmetrical to the serial bump with respect to a center of each of the chips to penetrate each of the chips; and alternately rotating and stacking the chips such that the serial TSV and the serial bumps of adjacent chips contact each other.

The method may further include: forming a parallel path for simultaneously inputting/outputting a first common signal to/from second internal circuits of the respective chips performing a designated operation.

Forming the parallel path may include: forming a first parallel bump for inputting/outputting the first common signal to/from the second internal circuit at the same position on one surface of each of the chips; forming a first parallel TSV for transferring the first common signal at the same position as the first parallel bump to penetrate each of the chips; forming a second parallel bump for inputting/outputting the first common signal to/from the second internal circuit at a position symmetrical to the first parallel bump with respect to the center of each of the chips on one surface of each of the chips; and forming a second parallel TSV for transferring the first common signal at the same position as the second parallel bump to penetrate each of the chips.

Forming the parallel path may further include: forming a first switch connected between the first parallel bump and the second internal circuit of each of the chips and selecting and transferring one of the first common signal and a second common signal to the second internal circuit; and forming a second switch connected between the second parallel bump and the second internal circuit of each of the chips and transferring the other of the first common signal and the second common signal not selected by the first switch to the second internal circuit.

Forming the parallel path may further include: forming a first control bump for transferring a first control signal for controlling the first switch to the first switch at the same position on one surface of each of the chips; forming a first control TSV for transferring the first control signal at the same position as the first control bump to penetrate each of the chips; forming a second control bump for receiving a second control signal for controlling the second switch and transferring the received second control signal to the second switch at a position symmetrical to the first control bump with respect to the center of each of the chips on one surface of each of the chips; and forming a second control TSV for transferring the second control signal at the same position as the second control bump to penetrate each of the chips.

BRIEF DESCRIPTION OF THE DRAWINGS

Example embodiments will be more clearly understood from the following detailed description taken in conjunction with the accompanying drawings, in which.

DETAILED DESCRIPTION OF THE EMBODIMENTS

Figure 1A:
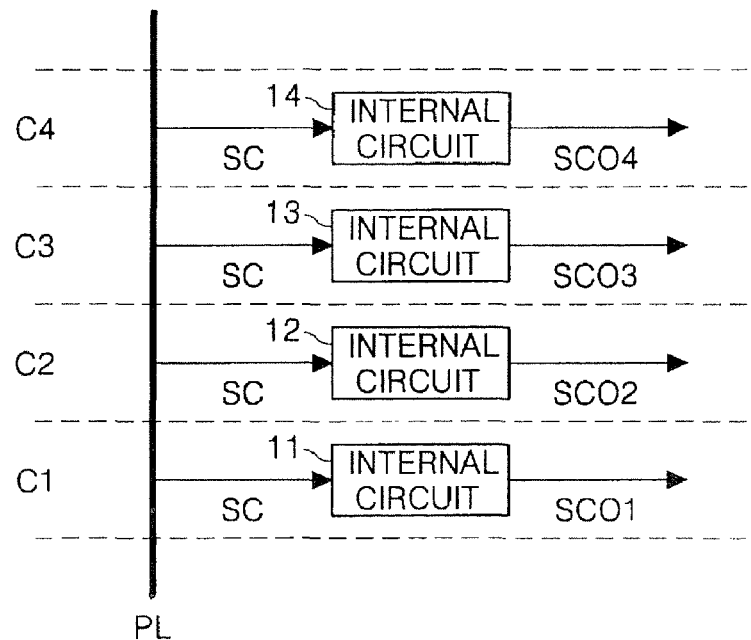
FIGS. 1A and 1B are schematic illustrations of conventional parallel and serial configurations of stacked chips, respectively.
Figure 1B:
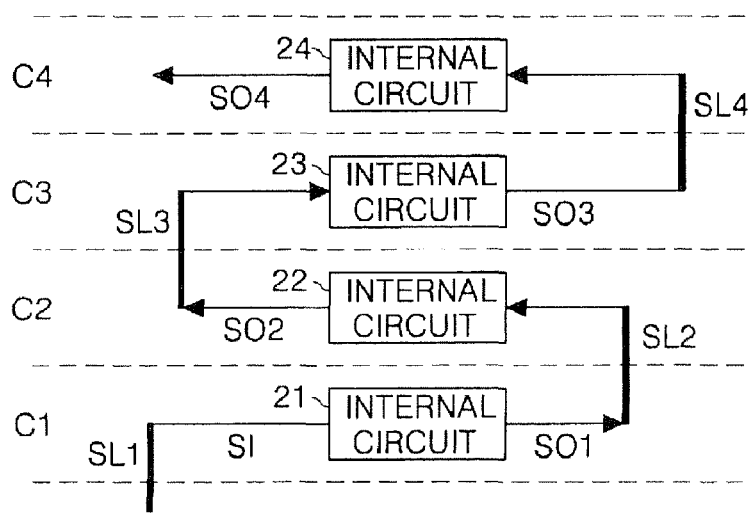
Figure 2A:
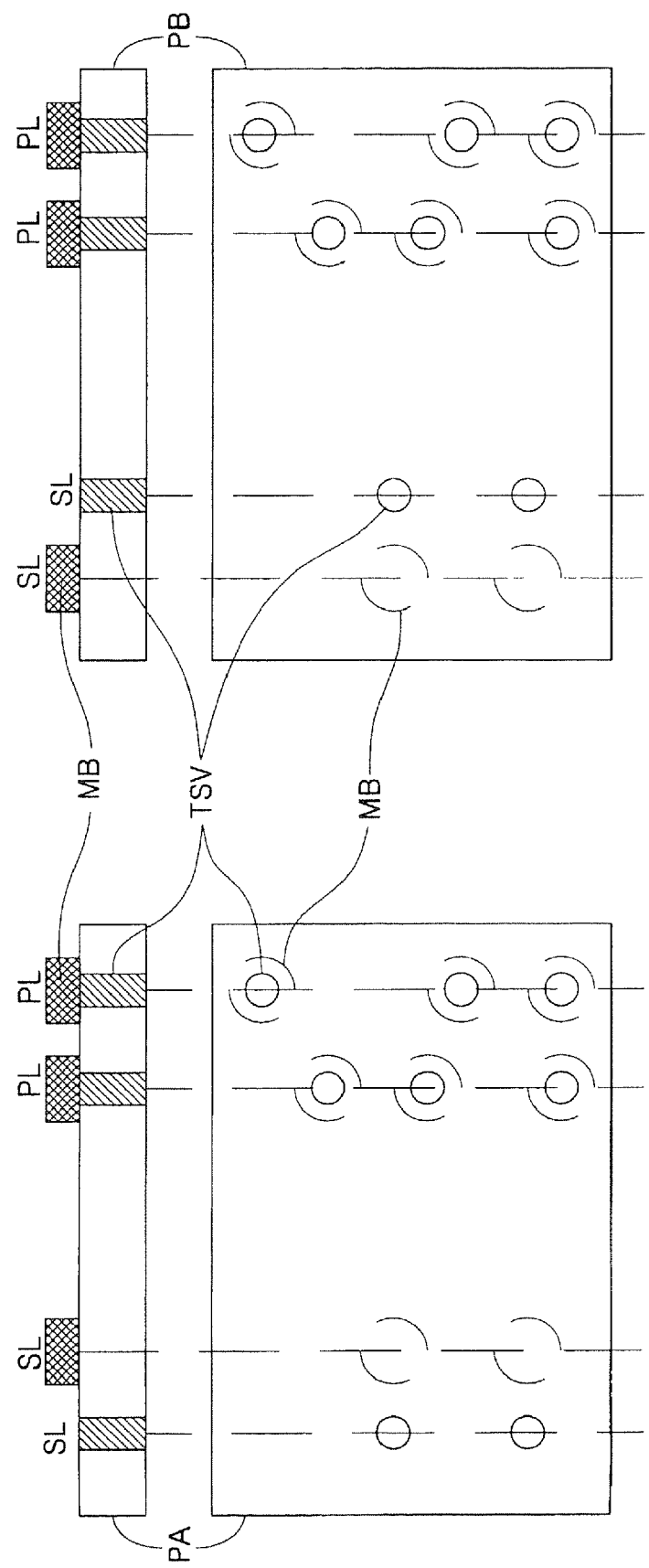
FIG. 2A illustrates views of configurations of PCs using conventional MB and via arrangements.
Figure 2B:
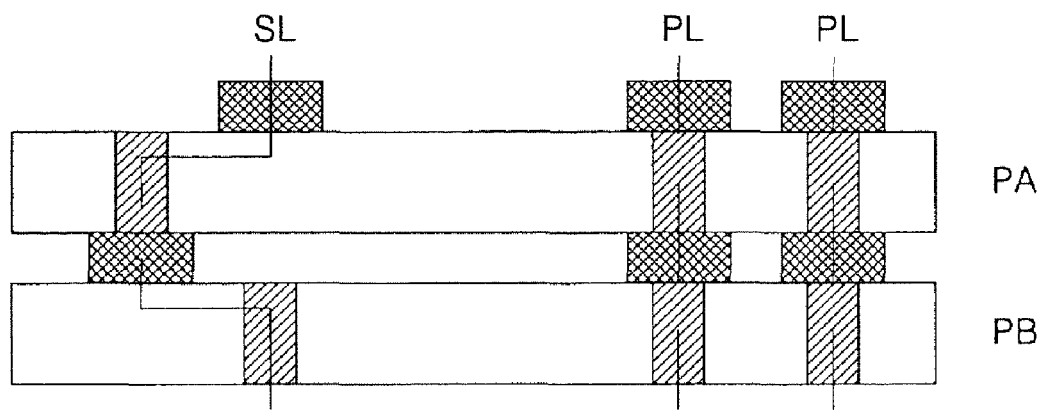
FIG. 2b illustrates a view of a configurations of stacked PCs using conventional MB and via arrangements.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," and/or "including" when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Figure 3:
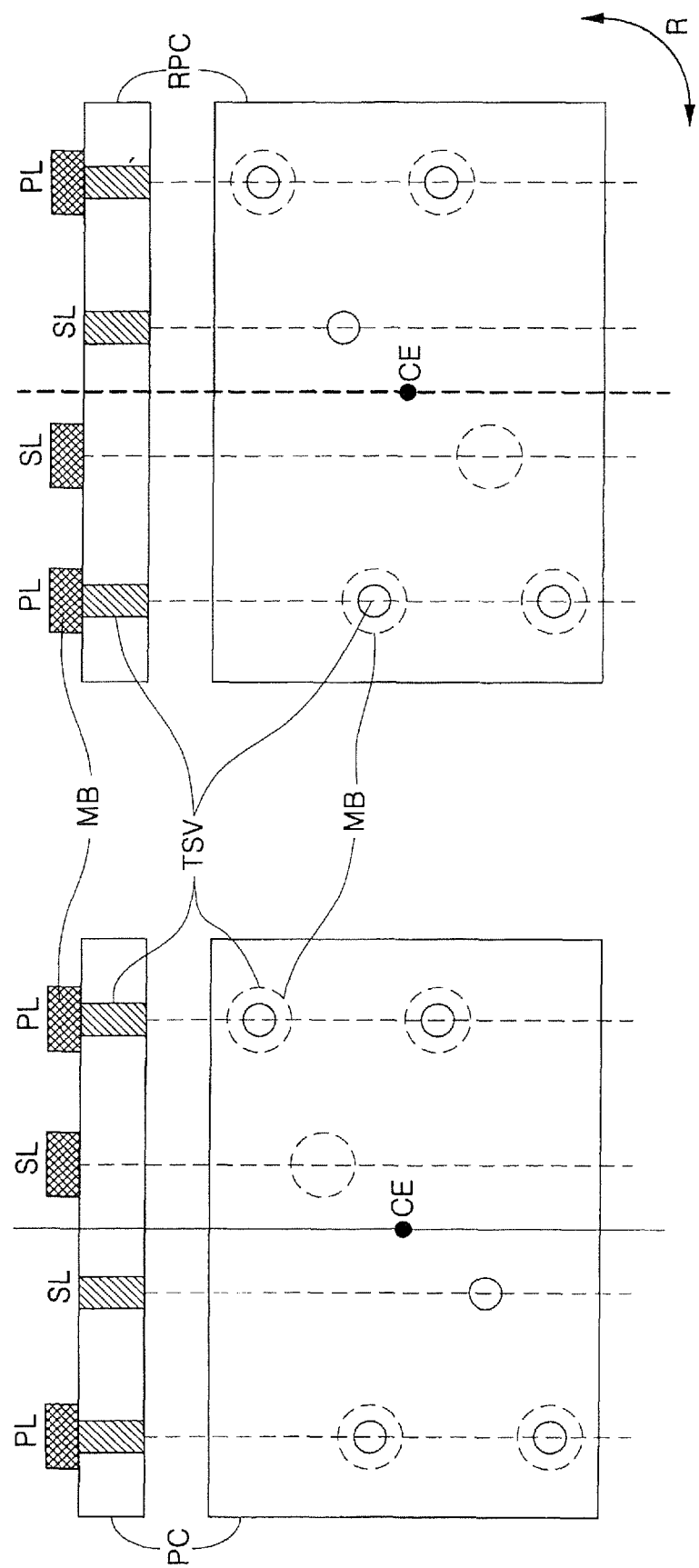
FIG. 3 illustrates an example of chips of a stacked semiconductor device according to an example embodiment of the present invention.

Relative terms, such as "lower" an "upper," may be used herein to describe one element's relationship to another element as illustrated in the Figures. It will be understood that relative terms are intended to encompass different orientations of the device in addition to the orientation depicted in the Figures. For example, if the structure in the FIG. 3 is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 3 illustrates an example of chips of a stacked semiconductor device according to an example embodiment of the present invention, wherein the chips on the stacked semiconductor device have only one pattern.

In a chip PC, a plurality of through-silicon vias TSV and bumps MB constituting parallel lines PL are disposed symmetrically to each other with respect to a center CE of the chip PC. In other words, the respective parallel lines PL have two pairs of the through-silicon vias TSV and the bumps MB symmetrical to each other with respect to the center CE. And, in a serial line SL, the bumps MB are disposed at positions symmetrical to via holes, in which the through-silicon vias TSV are disposed, with respect to the center CE. In the parallel lines PL constituting a parallel path, the through-silicon vias TSV and the bumps MB are disposed at the same positions. Thus, the through-silicon vias TSV and the bumps MB disposed symmetrically to the positions with respect to the center CE of the chip PC are disposed at the same positions. However, in the serial line SL constituting a serial path, the through-silicon via TSV and the bump MB are disposed at different positions, and thus the bump MB is disposed at a position symmetrical to the through-silicon via TSV with respect to the center CE of the chip PC.

A rotation (i.e., rotated) chip RPC is obtained by rotating (R) the chip PC by 180 degrees (in the plane of the drawing) about the center CE and has the same pattern as the chip PC. In the chip PC, two pairs of the through-silicon vias TSV and the bumps MB constituting the parallel lines PL are disposed symmetrically to each other with respect to the center CE of the chip PC. Thus, in the rotation chip RPC obtained by rotating the chip PC, the positions of the through-silicon vias TSV and the bumps MB constituting the parallel lines PL are the same as those in the chip PC. Here, when the chip PC and the rotation chip RPC are stacked, the parallel path is formed because the positions of the through-silicon vias TSV and the bumps MB constituting the parallel lines PL in the chip PC are the same as those in the rotation chip RPC.

Meanwhile, the bump MB constituting the serial line SL in the chip PC is disposed symmetrically to the through-silicon via TSV with respect to the center CE. Thus, in the rotation chip RPC, the bump MB is disposed at the position of the through-silicon via TSV in the chip PC. Likewise, in the rotation chip RPC, the through-silicon via TSV is disposed at the position of the bump MB in the chip PC. Therefore, when the chip PC and the rotation chip RPC are stacked, the through-silicon via TSV of the chip PC is disposed at the same position as the bump MB of the rotation chip RPC, and the bump MB of the chip PC is disposed at the same position as the through-silicon via TSV of the rotation chip RPC. As a result, the serial path is formed.

As mentioned above, the rotation chip RPC is the same as the chip PC except that it is rotated by 180 degrees about the center CE of the chip PC, and has the same via hole pattern as the chip PC. Thus, when the rotation chip RPC is rotated again by 180 degrees about the center CE, it becomes the same as the chip PC. Therefore, when a parallel path and a serial path can be formed by stacking the one chip PC and the one rotation chip RPC, they can also be formed by alternately stacking chips PC and rotation chips RPC.

Consequently, in the stacked semiconductor device using the chips PC having only one via hole pattern according to an example embodiment of the present invention, it is possible to form a parallel path and a serial path by alternatingly stacking the chips PC or using the chips PC without rotation as illustrated in FIG. 3. Consequently, the chip PC having one pattern may be the only thing to be considered in the design of the chip PC and its fabrication process.

Although not shown in the drawings, the chip PC and the rotation chip RPC have an internal circuit connected to the through-silicon vias TSV and the bumps MB constituting the parallel lines PL and an internal circuit connected between the through-silicon via TSV and the bump MB constituting the serial line SL. The internal circuits may be connected to all of the parallel lines PL and the serial line SL, or to the parallel lines PL and the serial line SL, respectively.

Figure 4:
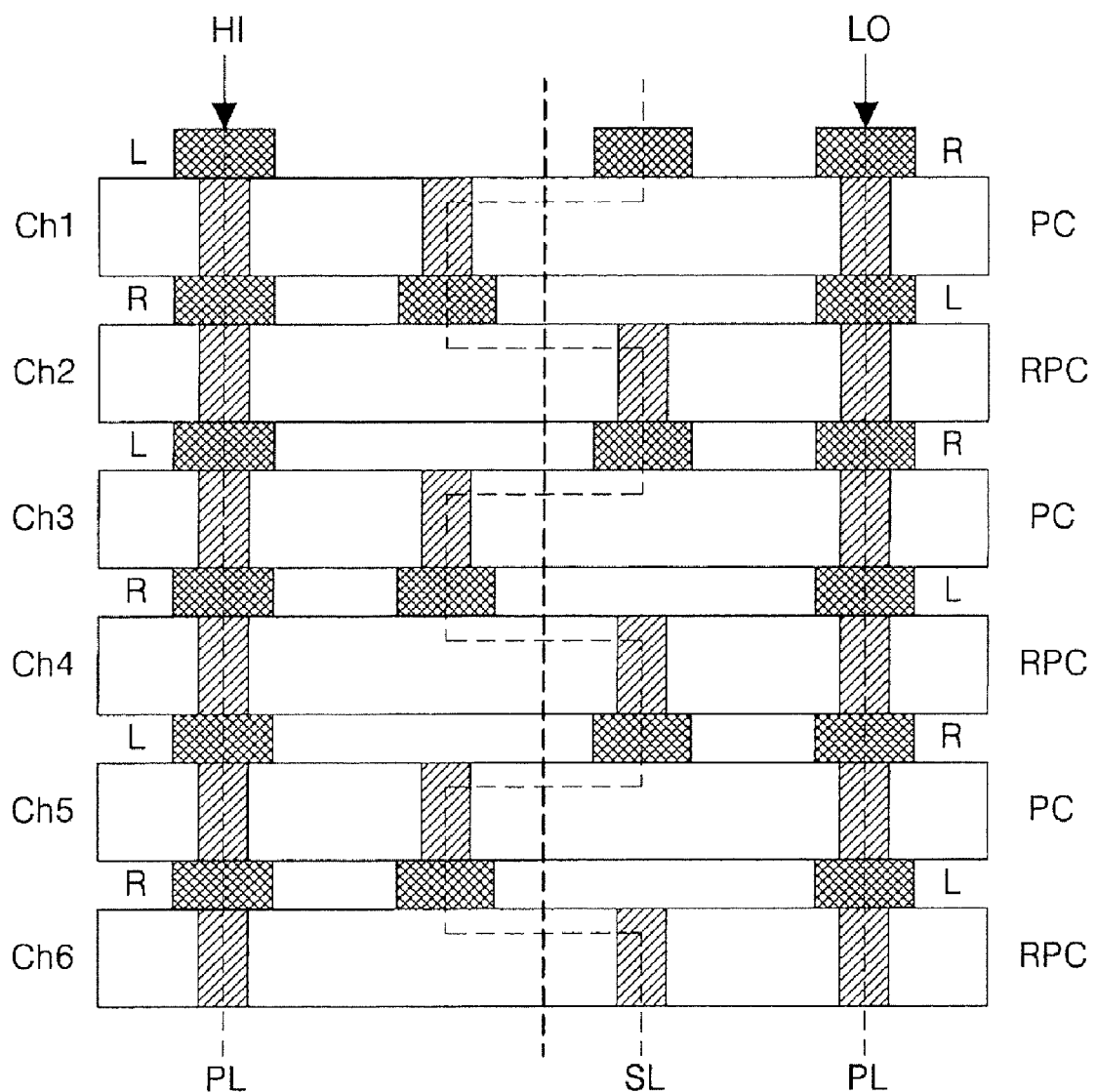
FIG. 4 illustrates a parallel path and a serial path formed by stacking the chips of FIG. 3.

FIG. 4 illustrates a parallel path and a serial path formed by stacking the chips 1o of FIG. 3. In FIG. 4, a stacked semiconductor device formed by sequentially stacking six chips Ch1 to Ch6 having one via hole pattern is shown. The odd-numbered chips Ch1, Ch3 and Ch5 are disposed (connected) without rotation, and the even-numbered chips Ch2, Ch4 and Ch6 are rotated.

As illustrated in FIG. 4, the chips Ch1 to Ch6 of the stacked semiconductor device according to an example embodiment of the present invention have only one via hole pattern, but a parallel path and a serial path are formed by alternately rotating and disposing the chips Ch1 to Ch6.

Internal circuits connected between the through-silicon vias TSV and the bumps MB constituting the serial line SL have the same signal input/output path regardless of whether or not the chips Ch1 to Ch6 are rotated. In other words, the internal circuits receive signals applied from the previous chips Ch1 to Ch5 through the bumps MB, perform designated operations, and output signals through the through-silicon vias TSV. Since the path of a signal input/output to/from the internal circuits is designated, it is not necessary to consider whether or not the chips PC and RPC having the internal circuits are rotated.

On the other hand, in order to form a parallel path regardless of whether or not the chips Ch1 to Ch6 are rotated, two parallel lines PL are utilized for one signal. In FIG. 3, the parallel lines PL disposed at positions symmetrical to each other with respect to the center CE of the chips PC and RPC are intended to transfer the same signal. Therefore, the two parallel lines PL form a parallel path for one signal.

Figure 5:
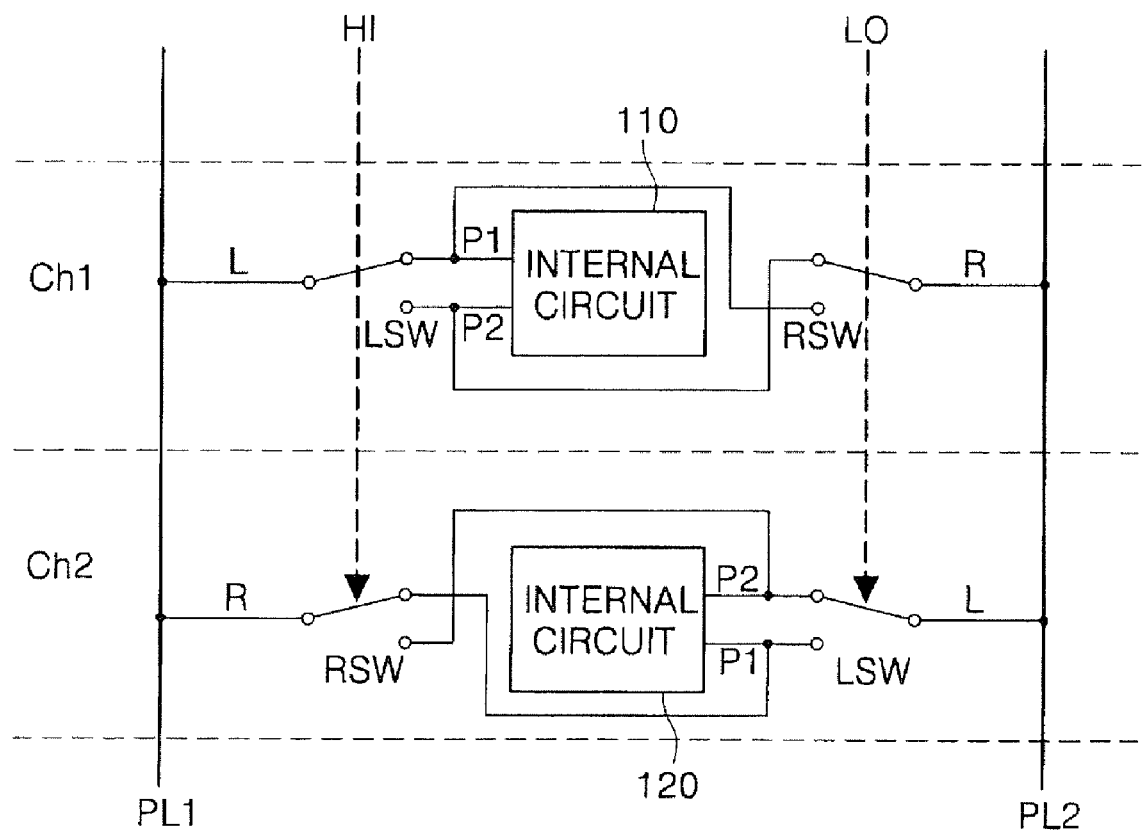
FIG. 5 illustrates a means for connecting parallel lines with internal circuits.

FIG. 5 illustrates a means for connecting parallel lines with internal circuits. Connection of the internal circuits of FIG. 5 will be described with reference to FIG. 4. In FIG. 5, an internal circuit 110 is connected to parallel lines PL1 and PL2 through two switches LSW and RSW. In a non-rotation chip, a line L disposed in the left part of the chip and a line R disposed in the right part of the chip are control lines added to receive a control signal for determining whether or not the chips Ch1 to Ch6 are rotated. One of the parallel lines PL1 and PL2 may be used as the control line. In FIG. 4, the odd-numbered chips Ch1, Ch3 and Ch5 are stacked without rotation, and thus the line L is disposed in the left part of the chips Ch1, Ch3 and Ch5, and the line R is disposed in the right part of the chips Ch1, Ch3 and Ch5. On the other hand, the even-numbered chips Ch2, Ch4 and Ch6 are rotated and disposed, and thus the line L is disposed in the right part of the chips Ch2, Ch4 and Ch6, and the line R is disposed in the left part of the chips Ch2, Ch4 and Ch6.

When a high-level control signal HI is applied to the left part of the stacked chips Ch1 to Ch6 and a low-level control signal LO is applied to the right part, the high-level control signal HI is applied to the line L and the low-level control signal LO is applied to the line R in the odd-numbered chips Ch1, Ch3 and Ch5. On the other hand, in the even-numbered chips Ch2, Ch4 and Ch6, the high-level control signal HI is applied to the line R and the low-level control signal LO is applied to the line L.

In FIG. 3, the switch LSW is connected between the parallel line PL1 disposed in the left part when a chip is not rotated and the internal circuit 110. In the odd-numbered chips Ch1, Ch3 and Ch5, the switch LSW selects a first path P1 in response to the high-level control signal HI. On the other hand, in the even-numbered chips Ch2, Ch4 and Ch6, the switch LSW selects a second path P2 in response to the low-level control signal LO. The switch RSW is connected between the parallel line PL2 disposed in the right part when a chip is not rotated and the internal circuit 110. In the odd-numbered chips Ch1, Ch3 and Ch5, the switch RSW selects the second path P2 in response to the low-level control signal LO. On the other hand, in the even-numbered chips Ch2, Ch4 and Ch6, the switch RSW selects the first path P1 in response to the high-level control signal HI. As a result, a path through which a signal is transferred to the internal circuits 110 and 120 may be selected in response to the level of the control signal applied to the lines L and R.

The internal circuits 110 and 120 may recognize that a signal input/output through the first path P1 is separate from a signal input/output through the second path P2, perform a designated operation corresponding to a signal applied through the selected path P1 or P2, and output an output signal through the selected path P1 or P2.

As illustrated in FIG. 5, when the respective chips of a stacked semiconductor device have a means for connecting to an internal circuit, the two parallel lines PL1 and PL2 are necessary to form parallel paths for two signals, so that the number of the parallel lines can be reduced.

In FIG. 5, the switches LSW and RSW are shown as the means for connecting the parallel lines PL1 and PL2 with the internal circuits 110 and 120, but can be replaced by Multiplexers (MUXs), etc.

In addition, while a plurality of chips are rotated by 180 degrees and stacked to form a parallel path and a serial path in the above-described stacked semiconductor device, a parallel line and a serial line can be formed by rotating the chips by 90 degrees or 270 degrees and stacking them.

Furthermore, a plurality of chips have the same size in the drawings, but chips having different sizes can also be used.

According to some embodiments, a plurality of stacked chips all have the same pattern but are alternately rotated about the center of the chips and disposed, so that a parallel path and a serial path can be formed.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed:

1. A stacked semiconductor device, comprising:
a plurality of chips each having a first internal circuit configured to receive an input signal, the first internal circuit configured to perform a designated operation and output an output signal, wherein each of the chips includes:
a serial bump disposed at a same position on one surface of each of the chips, configured to receive the input signal, and to transfer the received input signal to the first internal circuit; and
a serial Through-Silicon-Via (TSV), penetrating the chip and disposed at a position symmetrical to the serial bump with respect to a center of the chip and configured to receive and transfer the output signal, wherein the chips are alternately rotated and stacked on one another such that the serial TSV and the serial bumps of adjacent chips contact each other.

2. The stacked semiconductor device according to claim 1, wherein each of the chips further includes:
a second internal circuit for receiving/outputting a first common signal;
a first parallel bump disposed at the same position on the surface of each of the chips, and configured to input/output the first common signal to/from the second internal circuit;
a first parallel TSV disposed at a same position as the first parallel bump to penetrate the chip, and configured to transfer the first common signal;
a second parallel bump disposed at a position symmetrical to the first parallel bump with respect to the center of the chip on one surface of the chip, and configured to input/output the first common signal to/from the second internal circuit; and
a second parallel TSV disposed at a same position as the second parallel bump to penetrate the chip, and transferring the first common signal.

3. The stacked semiconductor device according to claim 2, wherein each of the chips further includes:
a first switch connected between the first parallel bump and the second internal circuit, and configured to select and transfer one of the first common signal and a second common signal to the second internal circuit; and
a second switch connected between the second parallel bump and the second internal circuit, and configured to transfer another of the first common signal and the second common signal to the second internal circuit.

4. The stacked semiconductor device according to claim 3, wherein each of the chips further includes:
a first control bump disposed at the same position on the surface of each of the chips, configured to receive a first control signal to control the first switch to select one of the first and second common signals, and to transfer the received first control signal to the first switch;
a first control TSV disposed at the same position as the first control bump to penetrate the chip, and configured to transfer the first control signal;
a second control bump disposed at a position symmetrical to the first control bump with respect to the center of the chip on one surface of the chip, configured to receive a second control signal for controlling the second switch to select the other of the first and second common signals, and to transfer the received second control signal to the second switch; and
a second control TSV disposed at the same position as the second control bump to penetrate the chip, and configured to transfer the second control signal.

5. The stacked semiconductor device according to claim 4, wherein the first and second switches comprise multiplexers (MUXs).

6. A method of forming a serial path of a stacked semiconductor device including a plurality of chips each having a first internal circuit for receiving an input signal, performing a designated operation and outputting an output signal, the method comprising:
forming a serial bump for receiving the input signal and transferring the received input signal to the first internal circuit at the same position on one surface of each of the chips;
forming a serial through-silicon via (TSV) for receiving the output signal and transferring the output signal at a position symmetrical to the serial bump with respect to a center of each of the chips to penetrate each of the chips; and alternately rotating and stacking the chips such that the serial TSV and the serial bumps of adjacent chips contact each other.

7. The method according to claim 6, further comprising:

forming a parallel path for simultaneously inputting/outputting a first common signal to/from second internal circuits of the respective chips performing a designated operation.

8. The method according to claim 7, wherein forming the parallel path includes:

forming a first parallel bump for inputting/outputting the first common signal to/from the second internal circuit at the same position on one surface of each of the chips;

forming a first parallel TSV for transferring the first common signal at the same position as the first parallel bump to penetrate each of the chips;

forming a second parallel bump for inputting/outputting the first common signal to/from the second internal circuit at a position symmetrical to the first parallel bump with respect to the center of each of the chips on one surface of each of the chips; and forming a second parallel TSV for transferring the first common signal at the same position as the second parallel bump to penetrate each of the chips.

9. The method according to claim 8, wherein forming the parallel path further includes:

forming a first switch connected between the first parallel bump and the second internal circuit of each of the chips and selecting and transferring one of the first common signal and a second common signal to the second internal circuit; and forming a second switch connected between the second parallel bump and the second internal circuit of each of the chips and transferring the other of the first common signal and the second common signal to the second internal circuit.

10. The method according to claim 9, wherein forming the parallel path further includes:

forming a first control bump for transferring a first control signal for controlling the first switch to the first switch at the same position on one surface of each of the chips;

forming a first control TSV for transferring the first control signal at the same position as the first control bump to penetrate each of the chips;

forming a second control bump for receiving a second control signal for controlling the second switch and transferring the received second control signal to the second switch at a position symmetrical to the first control bump with respect to the center of each of the chips on one surface of each of the chips; and forming a second control TSV for transferring the second control signal at the same position as the second control bump to penetrate each of the chips.

* * * * *